(12) United States Patent
Hayashi

(10) Patent No.: US 11,677,407 B2
(45) Date of Patent: Jun. 13, 2023

(54) ANALOG-TO-DIGITAL CONVERTER

(71) Applicant: SANKEN ELECTRIC CO., LTD., Niiza (JP)

(72) Inventor: Hideki Hayashi, Niiza (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 80 days.

(21) Appl. No.: 17/488,646

(22) Filed: Sep. 29, 2021

(65) Prior Publication Data

US 2022/0149853 A1 May 12, 2022

Related U.S. Application Data

(63) Continuation of application No. PCT/JP2020/041990, filed on Nov. 11, 2020.

(51) Int. Cl.
*H03M 1/06* (2006.01)
*H03M 1/10* (2006.01)
*H03M 1/46* (2006.01)

(52) U.S. Cl.
CPC ....... *H03M 1/0607* (2013.01); *H03M 1/1042* (2013.01); *H03M 1/466* (2013.01)

(58) Field of Classification Search
CPC ..... H03M 1/0607; H03M 1/1042; H03M 1/46
See application file for complete search history.

(56) References Cited

U.S. PATENT DOCUMENTS

| 10,826,521 B1* | 11/2020 | Huang ............... H03M 1/1245 |
| 10,917,100 B2* | 2/2021 | Rattan .................. H03M 1/002 |
| 2009/0195424 A1 | 8/2009 | Van Der Plas et al. |
| 2013/0021189 A1 | 1/2013 | Kabir et al. |

FOREIGN PATENT DOCUMENTS

| JP | S59-97220 A | 6/1984 |
| JP | H05-346441 A | 12/1993 |
| JP | H07-86947 A | 3/1995 |
| JP | H11-88166 A | 3/1999 |
| JP | 2002-111494 A | 4/2002 |
| JP | 2007-318457 A | 12/2007 |
| JP | 2010-109937 A | 5/2010 |

\* cited by examiner

*Primary Examiner* — Khai M Nguyen
(74) *Attorney, Agent, or Firm* — Metrolex IP Law Group, PLLC

(57) ABSTRACT

One or more embodiments of a successive approximation type analog-to-digital converter that converts an analog input into a digital conversion value and outputs the digital conversion value, may include: a capacitance DAC that generates a bit-by-bit potential based on an analog input; a comparator that compares the potential generated by the capacitance DAC, wherein the comparator is a memory cell rewriting type, the comparator includes a first stage current mirror type operational amplifier; and a second stage memory cell; a conversion data generator that generates conversion data of resolution bits based on a comparison result of the comparator; and a correction circuit that corrects an output error of the conversion data caused by an offset error of the comparator by adding or subtracting an offset correction value that is a fixed value, and outputs the conversion data as a digital conversion value.

11 Claims, 2 Drawing Sheets

ANALOG-TO-DIGITAL CONVERTER

CROSS REFERENCE TO RELATED APPLICATIONS

This application is a continuation application of International Application No. PCT/JP2020/041990, filed on Nov. 11, 2020, the entire contents of which are incorporated herein by reference.

BACKGROUND

The disclosure relates to an analog-to-digital converter (hereinafter referred to as an A/D converter), and in particular, to a successive approximation type A/D converter.

An A/D converter is a device that converts an input analog "voltage" into a numerical value for the purpose of digital processing, and a successive approximation type is often used because of its good balance of high-speed performance, area, and power consumption.

A successive approximation type A/D converter compares potentials generated by a capacitance DAC based on analog input potentials with a comparator, feeds back the results of the comparison to a conversion data generator, and conveys the approximate data candidates to the capacitance DAC. This repetition is repeated for resolution bits (n bits: n times) to obtain digital conversion values.

A comparator is a circuit with a large current consumption in an A/D converter, and a memory cell rewriting type is used which has a small current consumption and high speed (see for example, Patent Publication No. JPH05-346441A (Patent Document 1) and Patent Publication No. JP2010-109937A (Patent Document 2)). As illustrated in FIG. 4, a memory cell rewriting type comparator includes a first stage current mirror type operational amplifier 10 and a second stage memory cell 20, wherein the output of the operational amplifier 10 is connected to "L" and "R" of the memory cell 20. A slight difference in the potentials of "L" and "R" at the instant when the memory cell 20 is turned on by a clock determines the 0/1 of the memory cell 20.

However, a memory cell rewrite type comparators has a large offset error. For this reason, related technologies for avoiding or reducing the offset error are disclosed.

One technology is to increase the gate width of the elements that comprise a comparator. For example, for the gate width of the MOS transistor in the first stage operational amplifier 10, the offset error becomes small in inverse proportion to the 1/square of the gate width.

However, when the gate width is increased, the current is inversely proportionally reduced and the gate capacitance is proportionally increased, so that the gate length must be increased to obtain the same speed, which increases the layout area and also increases the current consumption.

In a memory cell rewriting type comparator, the difference in parasitic capacitance due to wiring of the "L" and "R" nodes also produces an offset error. There is a method of offset correction by adding a changeable capacitance to the "L" and "R" nodes to take advantage of the above-mentioned effect. However, this method requires incorporated multiple structures of capacitive elements with switches, each of which is a huge mechanism in terms of layout, resulting in an increase in the layout area.

Thus, if a circuit is designed to have a small offset error, the circuit comprises a large layout area and a large current consumption. In addition, if a circuit for correcting an offset error is added to an analog circuit, it results in adding a circuit with a larger layout area than that of the comparator circuit.

SUMMARY

One or more embodiments of a successive approximation type analog-to-digital converter that converts an analog input into a digital conversion value and outputs the digital conversion value, may include: a capacitance DAC that generates a bit-by-bit potential based on an analog input; a comparator that compares the potential generated by the capacitance DAC, wherein the comparator is a memory cell rewriting type, the comparator includes a first stage current mirror type operational amplifier; and a second stage memory cell; a conversion data generator that generates conversion data of resolution bits based on a comparison result of the comparator; and a correction circuit that corrects an output error of the conversion data caused by an offset error of the comparator by adding or subtracting an offset correction value that is a fixed value, and outputs the conversion data as a digital conversion value.

One or more embodiments of a method of setting an output of a successive approximation type analog-to-digital converter comprising a capacitance DAC that generates a bit-by-bit potential based on an analog input, a comparator that compares potentials generated by the capacitance DAC, and a conversion data generator that generates conversion data of a resolution bit based on a comparison result of the comparator, may include: storing an output error of the conversion data as an offset correction value in a non-volatile memory, the output error of the conversion data being caused by an offset error of a memory cell rewriting type comparator comprising a first stage current mirror type operational amplifier and a second stage memory cell; setting if the offset correction value stored in the non-volatile memory is stored to a register; adding or subtracting a value stored in the register to or from the conversion data; and outputting the result as a digital conversion value.

DETAILED DESCRIPTION

A/D converters according to one or more embodiments are explained below in accordance with the accompanying drawings.

Figure 1:
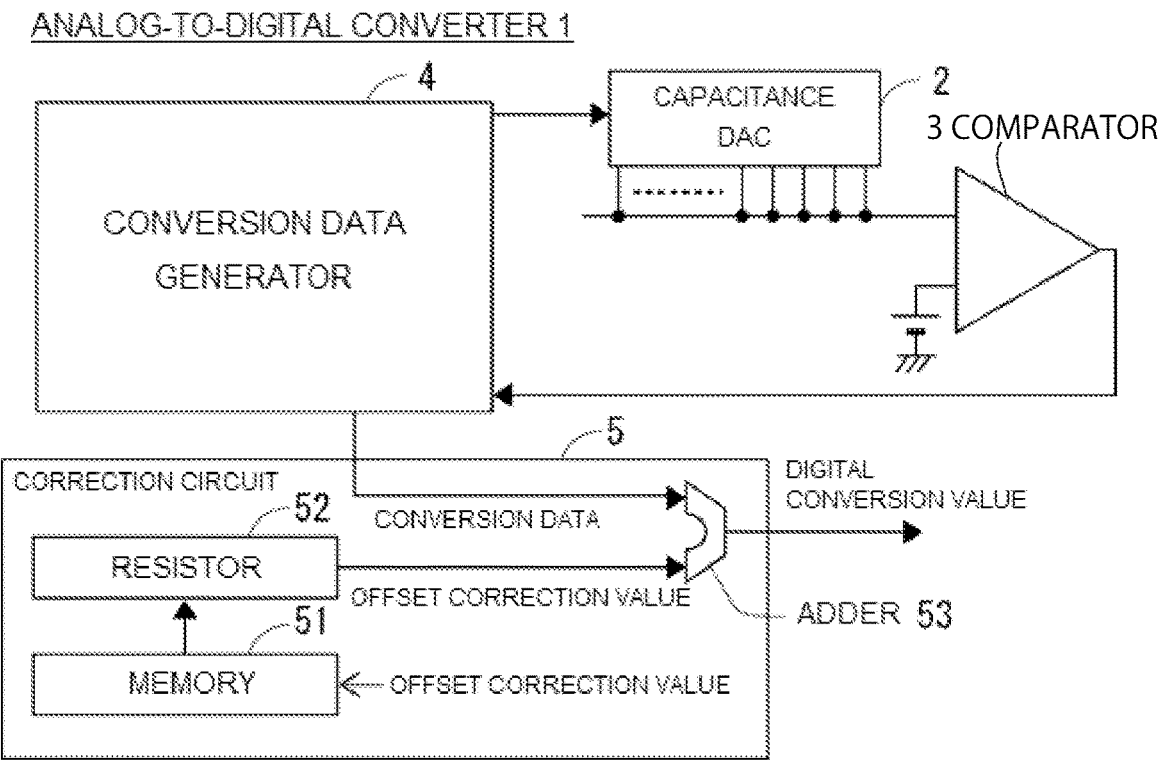
FIG. 1 is a block diagram illustrating an A/D converter according to one or more embodiments.

FIG. 1 is a block diagram illustrating an A/D converter according to one or more embodiments. An A/D converter 1 is a successive approximation type and includes a capacitance DAC 2, a comparator 3, a conversion data generator 4, and a correction circuit 5.

In the A/D converter 1, potentials generated by the capacitance DAC 2 based on analog input potentials are compared by the comparator 3, the result is fed back to the conversion data generator 4, and the conversion data generator 4 conveys the approximate data candidates to the capacitance DAC 2. This repetition is repeated for the resolution bit (n bits: n times), and the conversion data generator 4 outputs conversion data of the resolution bit.

Figure 4:
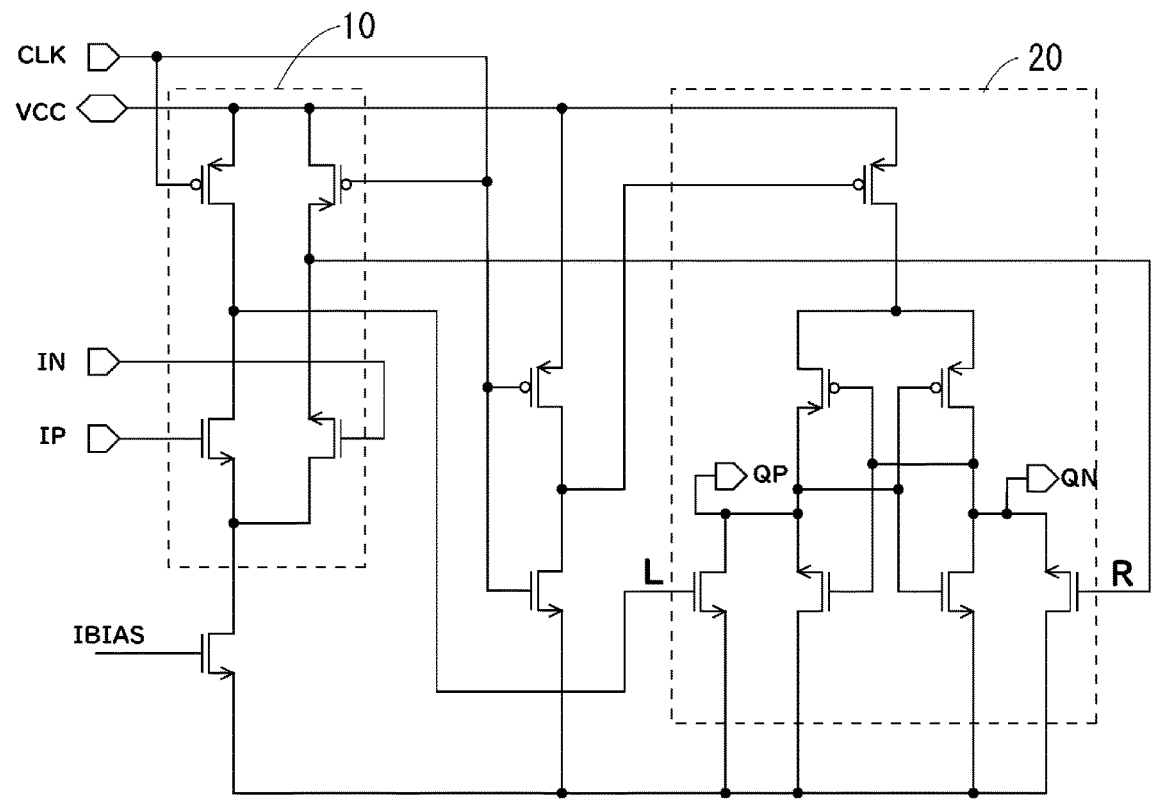
FIG. 4 is a block diagram illustrating a comparator according to one or more embodiments.

FIG. 4 is a block diagram illustrating a comparator according to one or more embodiments. This comparator is a memory cell rewriting type including a current mirror type operational amplifier 10 in a first stage and a memory cell 20 in a second stage. The gate width of the elements comprising the comparator 3 may be configured with the minimum gate width of an IC process (e.g., gate width of 0.1 μm) or a gate width close thereto (gate width of 0.2 μm or less), and a not small offset error may be allowed. For example, when the gate width is 0.1 μm, the offset error is ±60 mV. This is a large output error that corresponds to the maximum of 206 LSBs (1 LSB is 0.29 mV) in terms of 12-bit resolution.

The correction circuit 5 is a circuit for correcting an output error caused by an offset error of the comparator 3 from the conversion data output from the conversion data generator 4, and includes a memory 51, a register 52, and an adder 53.

The memory 51 may be a non-volatile memory such as a flash memory, and the output error of the conversion data output from the conversion data generator 4 measured in a shipping inspection may be stored as an offset correction value.

The register 52 may be a temporary storage circuit in which an offset correction value read from the memory 51 is stored. It may be configured to be settable whether or not to store the offset correction value in the register 52. For example, when the reading of the offset correction value from the memory 51 and the storing of the offset correction value in the register 52 are performed by a host device operating under program control, the user can set whether or not to store the offset correction value in the register 52 by the program. The value of the register 52 in which the offset correction value is not stored is "0".

The adder 53 may be a digital adder. The adder 53 digitally adds the value stored in the register 52 to the conversion data output from the conversion data generator 4 and outputs the result as a digital conversion value of the A/D converter 1. Accordingly, when the offset correction value is stored in the register 52, the value obtained by digitally adding the offset correction value to the conversion data output from the conversion data generator 4 is output as the digital conversion value of the A/D converter 1, and when the offset correction value is not stored in the register 52, the conversion data output from the conversion data generator 4 is output as the digital conversion value of the A/D converter 1.

Figure 2:
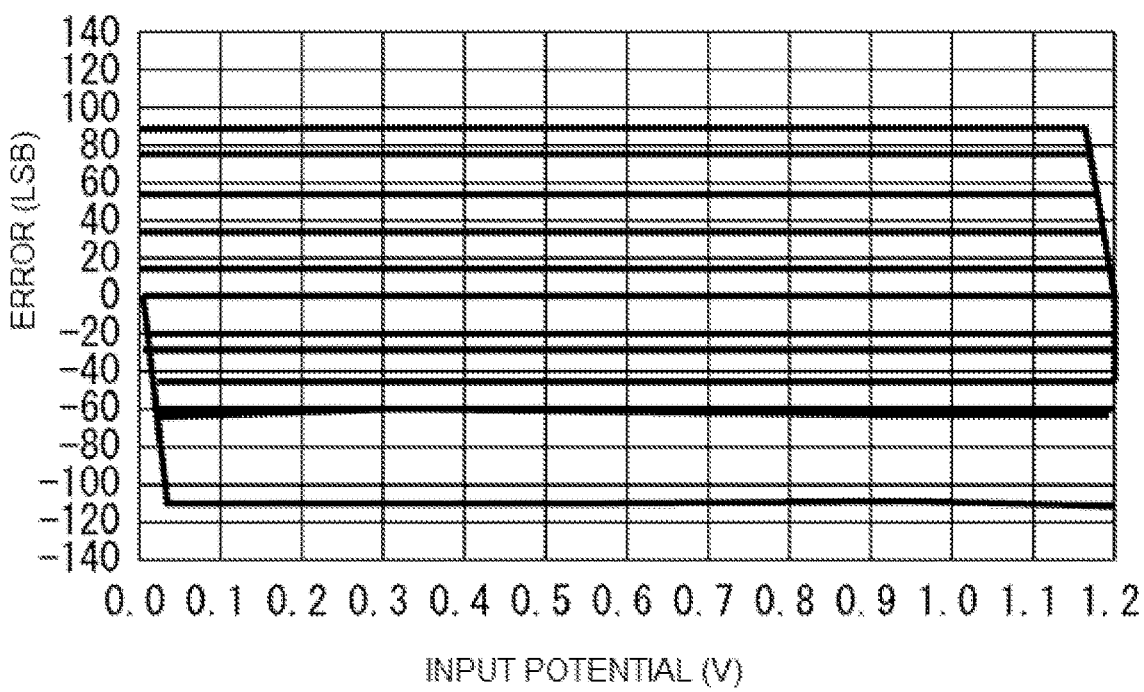
FIG. 2 is a diagram illustrating output errors of a conversion data output from a conversion data generator such as illustrated in FIG. 1.

FIG. 2 is a diagram illustrating output errors of the conversion data output from the conversion data generator illustrated in FIG. 1. More specifically, FIG. 2 illustrates output errors of the conversion data output from the conversion data generator 4 when the comparator 3 is configured with the minimum gate width allowed by the process. Referring to FIG. 2, a large margin of errors about ±120 LSBs is observed. This is due to variations in element characteristics of individual circuits and wiring parasitic capacitances.

As a result of a close examination of the output errors in FIG. 2, the inventor finds that the output errors are constant regardless of input potentials. Moreover, these output errors are constant without being affected by temperature. If output errors are constant, or in other words, if the margin of output errors is known, the output error of the conversion data output from the conversion data generator 4 is measured in a shipping inspection, and the measured output error, which is considered as the offset correction value, may be corrected by simply adding or subtracting the offset correction value to the conversion data output from the conversion data generator 4.

Figure 3:
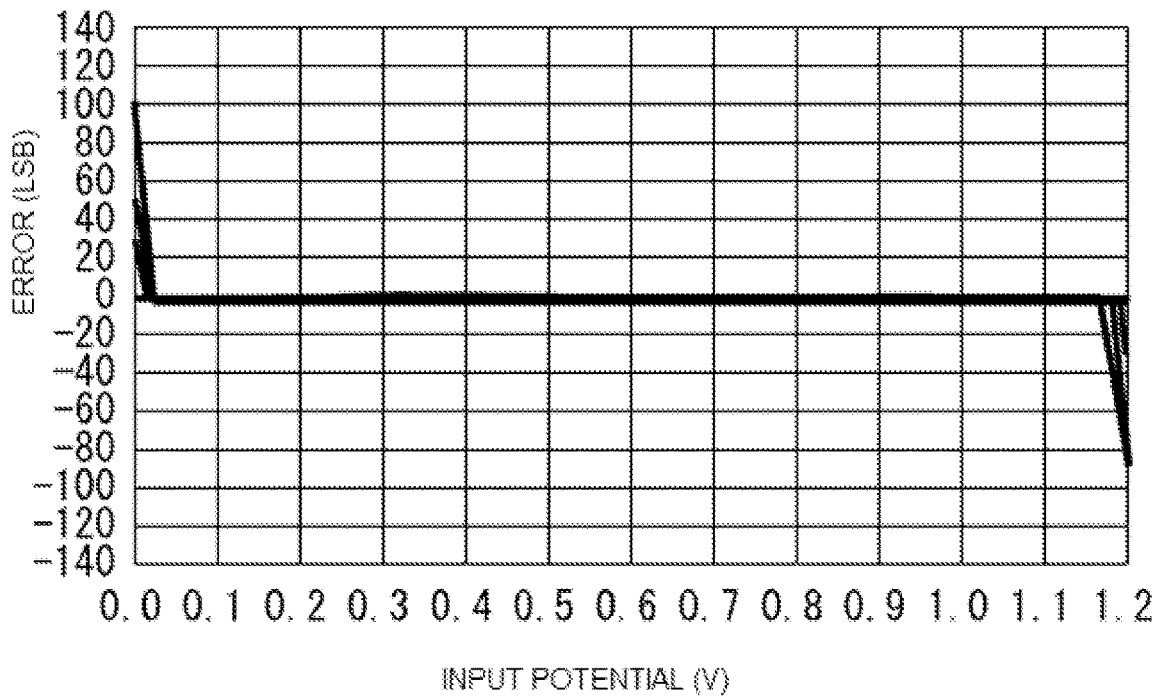
FIG. 3 is a diagram illustrating output errors of digital conversion values corrected by a correction circuit such as illustrated in FIG. 1.

FIG. 3 is a diagram illustrating output errors of digital conversion values corrected by the correction circuit illustrated in FIG. 1. More specifically, FIG. 3 illustrates digital conversion values of the A/D converter 1 output from the correction circuit 5. FIG. 3 indicates that output errors of the conversion data output from the conversion data generator 4 are corrected and fine results are obtained.

As explained above, one or more embodiments may comprise a capacitance DAC 2 that generates a bit-by-bit potential based on analog input, a comparator 3 that compares potentials generated by the capacitance DAC 2, and a conversion data generator 4 that generates conversion data of resolution bits based on the comparison result of the comparator 3, and may be a successive approximation type A/D converter 1 that converts the analog input into digital conversion values and outputs the digital conversion values. The comparator 3 may be a memory cell rewriting type comprising a current mirror type operational amplifier 10 in a first stage and a memory cell 20 in a second stage. The comparator 3 also comprises a correction circuit 5 that corrects output errors of the conversion data caused by offset errors of the comparator 3 by adding or subtracting an offset correction value, which is a fixed value, and that outputs corrected conversion data as a digital conversion value.

Since this configuration may correct output errors of the conversion data by adding or subtracting offset correction values, the offset error in the memory cell rewriting type comparator 3 may be tolerated, and the high-speed A/D converter 1 with small current consumption may be achieved without increasing the layout area or current consumption of the comparator 3.

In one or more embodiments, the offset correction value is an output error of the conversion data output from the conversion data generator 4 measured in a shipping inspection. With this configuration, the offset correction value may be set only by measuring the output error of the conversion data output from the conversion data generator 4 in the shipping inspection.

In one or more embodiments, the correction circuit 5 comprises a non-volatile memory (memory 51) in which offset correction values are stored, a register 52 in which the offset correction values stored in the memory 51 may be selectively stored, and a digital adder that adds and subtracts the values stored in the register to and from the conversion data (adder 53).

This configuration allows the user to select whether the conversion data output from the conversion data generator 4 is to be offset correction or not.

For example, when the user wants to treat the digital conversion value output from the A/D converter 1 as a relative value rather than an absolute value, that is, when 'the user wants to control "D", which is the digital conversion value output from the A/D converter 1, to be between "D−10" and "D+10",' "offset correction" is not necessary; therefore, the operation of reading the offset correction value from the memory 51 and storing the offset correction value in the register 52 may be omitted.

On the other hand, when the user wants to treat the A/D conversion value as an absolute value, that is, when the user wants to control the digital conversion value "D" obtained by the A/D converter 1' to be '1.0 V ("D"=the conversion range of the A/D converter 1 with 3413:12-bit is between 0 and 1.2 V),' the value of the digital conversion value must be absolute; therefore, the operation of reading the offset correction value from the memory 51 and storing the offset correction value in the register 52 is necessary to be performed.

In one or more embodiments, the gate width of the elements comprising the comparator 3 may be 0.2 μm or less. With this configuration, the layout area and the current consumption of the comparator 3 may be reduced.

In one or more embodiments, the gate width of the elements comprising the comparator 3 may be the minimum gate width of the IC process.

With this configuration, the layout area and current consumption of comparator 3 may be reduced.

An A/D converter according to one or more embodiments may eliminate offset errors without increasing the layout area or current consumption, even if a A/D converter includes a memory cell rewriting type comparator.

An A/D converter according to one or more embodiments may accept the offset error in a memory cell rewriting type comparator since the output error of the conversion data may be corrected by adding and subtracting offset correction values. Therefore, an A/D converter according to one or more embodiments may provide an A/D converter with a small current consumption without increasing the layout area and current consumption of a comparator.

The present invention may not be limited to the above-described embodiments, and that each embodiment may be changed as appropriate within the scope of the technical concept of the present invention. The number, position, shape, etc. of the above-described components may not be limited to the above-described embodiments, and may be made into a number, position, shape, etc. suitable for implementing the present invention. The same sign is assigned to the same component in each figure.

The invention claimed is:

1. A successive approximation type analog-to-digital converter that converts an analog input into a digital conversion value and outputs the digital conversion value, comprising:
    a capacitance DAC that generates a bit-by-bit potential based on an analog input;
    a comparator that compares the potential generated by the capacitance DAC, wherein the comparator is a memory cell rewriting type, the comparator comprises:
        a first stage current mirror type operational amplifier; and
        a second stage memory cell;
    a conversion data generator that generates conversion data of resolution bits based on a comparison result of the comparator; and
    a correction circuit that corrects an output error of the conversion data caused by an offset error of the comparator by adding or subtracting an offset correction value that is a fixed value, and outputs the conversion data as a digital conversion value.

2. The analog-to-digital converter according to claim 1, wherein
    the offset correction value comprises an output error of the conversion data output from the conversion data generator measured in a shipping inspection.

3. The analog-to-digital converter according to claim 1, wherein the correction circuit comprises
    a non-volatile memory in which the offset correction value is stored;
    a register that is capable of selectively storing the offset correction value stored in the non-volatile memory; and
    a digital adder that adds and subtracts values stored in the register to and from the conversion data.

4. The analog-to-digital converter according to claim 2, wherein the correction circuit comprises
    a non-volatile memory in which the offset correction value is stored;
    a register that is capable of selectively storing the offset correction value stored in the non-volatile memory; and
    a digital adder that adds and subtracts values stored in the register to and from the conversion data.

5. The analog-to-digital converter according to claim 1, wherein
    a gate width of elements comprising the comparator is 0.2 μm or less.

6. The analog-to-digital converter according to claim 2, wherein
    a gate width of elements comprising the comparator is 0.2 μm or less.

7. The analog-to-digital converter according to claim 3, wherein
    a gate width of elements comprising the comparator is 0.2 μm or less.

8. The analog-to-digital converter according to claim 1, wherein
    a gate width of elements comprising the comparator is the minimum gate width of an IC process.

9. The analog-to-digital converter according to claim 2, wherein
    a gate width of elements comprising the comparator is the minimum gate width of an IC process.

10. The analog-to-digital converter according to claim 3, wherein
    a gate width of elements comprising the comparator is the minimum gate width of an IC process.

11. A method of setting an output of a successive approximation type analog-to-digital converter comprising a capacitance DAC that generates a bit-by-bit potential based on an analog input, a comparator that compares potentials generated by the capacitance DAC, and a conversion data generator that generates conversion data of a resolution bit based on a comparison result of the comparator, comprising
    storing an output error of the conversion data as an offset correction value in a non-volatile memory, the output error of the conversion data being caused by an offset error of a memory cell rewriting type comparator comprising a first stage current mirror type operational amplifier and a second stage memory cell;
    setting if the offset correction value stored in the non-volatile memory is stored to a register;
    adding or subtracting a value stored in the register to or from the conversion data; and
    outputting the result as a digital conversion value.

* * * * *